United States Patent
Kawama et al.

(10) Patent No.: US 6,788,736 B1
(45) Date of Patent: Sep. 7, 2004

(54) MATCHED FILTER

(75) Inventors: Shuichi Kawama, Kyoto (JP);
Kunihiko Iizuka, Sakurai (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/375,363

(22) Filed: Aug. 17, 1999

(30) Foreign Application Priority Data

Aug. 26, 1998 (JP) .......................................... 10-239864

(51) Int. Cl.$^7$ .......................................... H04B 1/707
(52) U.S. Cl. ..................................... 375/152; 375/343
(58) Field of Search ................................ 375/142, 143, 375/150, 152, 343; 708/314, 422, 425, 426; 370/320, 335, 342, 441

(56) References Cited

U.S. PATENT DOCUMENTS

| | | | |
|---|---|---|---|
| 4,939,472 A | | 7/1990 | Uchida et al. |
| 5,638,362 A | * | 6/1997 | Dohi et al. ................. 370/342 |
| 5,671,221 A | * | 9/1997 | Yang .......................... 370/320 |
| 5,960,033 A | | 9/1999 | Shibano et al. |
| 6,031,415 A | * | 2/2000 | Shou et al. ................. 375/343 |
| 6,275,545 B1 | * | 8/2001 | Suzuki ........................ 375/343 |

FOREIGN PATENT DOCUMENTS

| | | |
|---|---|---|
| EP | 0749215 A2 | 12/1996 |
| JP | 1125668 | 5/1989 |
| JP | 3 88526 | 4/1991 |
| JP | 9 46231 | 2/1997 |
| JP | 2688691 | 8/1997 |

OTHER PUBLICATIONS

D.T. Magill, G. Edwards "Digital Matched Filter ASIC", Proceedings of the Military Communications Conference (MILCOM), IEEE–vol. 30 Sep. 1990; pp. 235–238.

* cited by examiner

*Primary Examiner*—Betsy L. Deppe
(74) *Attorney, Agent, or Firm*—Birch, Stewart, Kolasch & Birch, LLP

(57) ABSTRACT

A matched filter for inversely spreading a received signal using spreading signals in a spread spectrum communications receiver includes: a plurality of correlators for determining cross-correlation functions of a received signal which has been sampled at a certain timing and spreading signals having a certain section length; a delay circuit for successively transferring the spreading signals having a certain section length with respect to the plurality of correlating means by delaying timings of the transfer by a period equal to the section length of the spreading signals; and a multiplexer for successively selecting one of the cross-correlation functions outputted from the plurality of correlating means, by a period equal to a sampling interval of the received signal. As a result, a matched filter with a small circuit size and low power consumption is realized.

23 Claims, 6 Drawing Sheets

F I G. 1
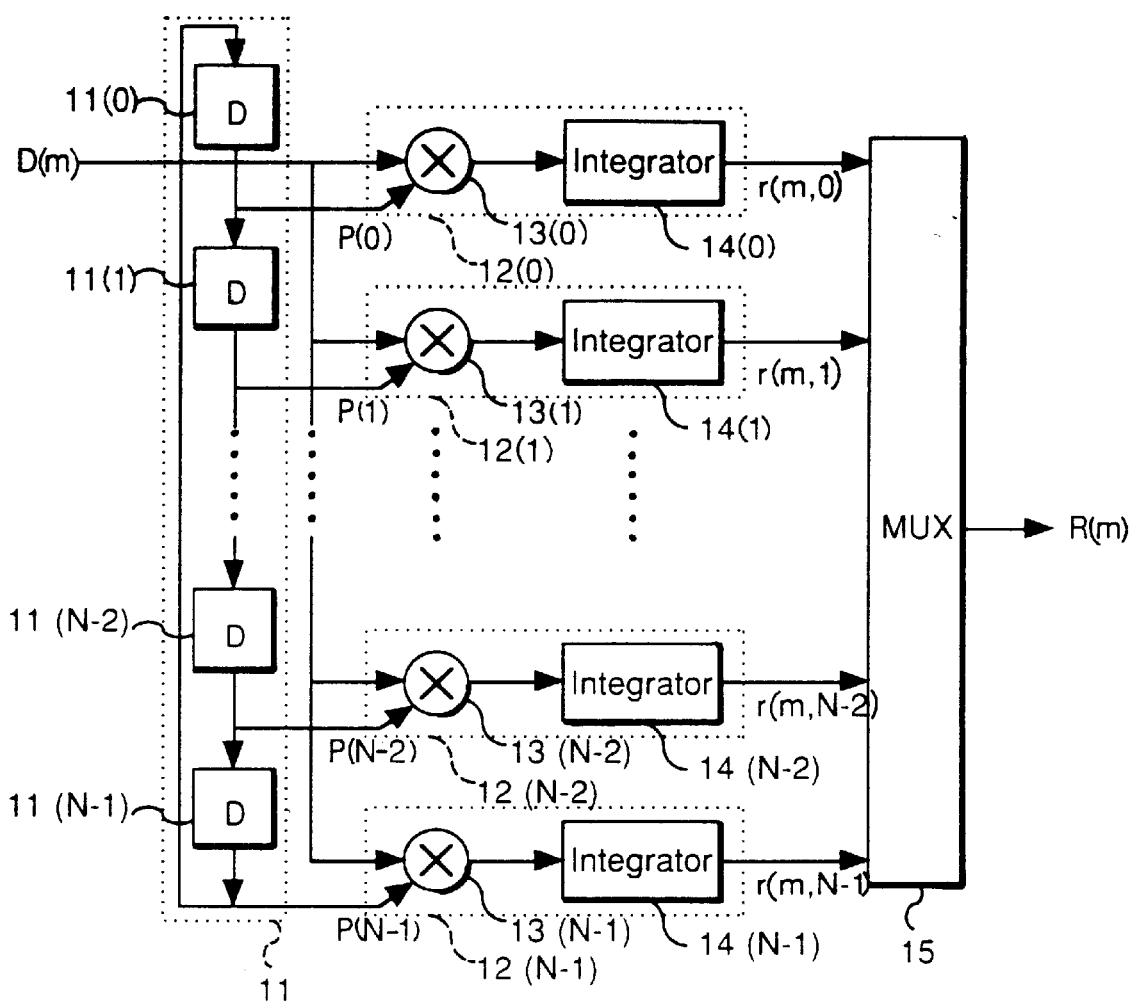

FIG. 6 PRIOR ART
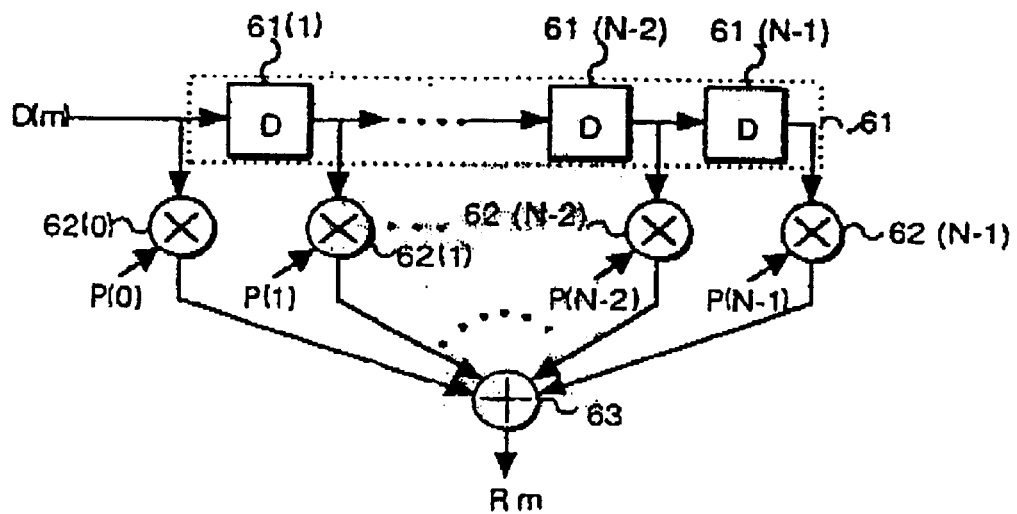
FIG. 7 PRIOR ART
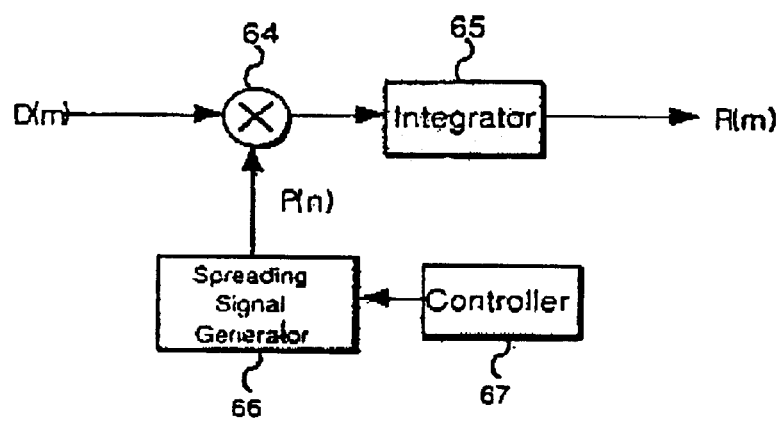
FIG. 8 PRIOR ART
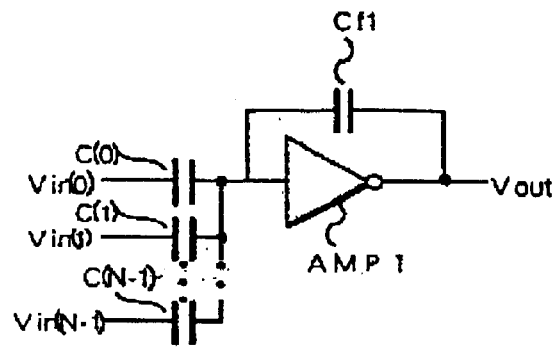

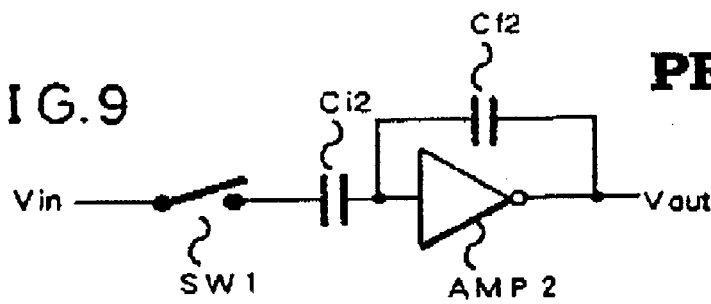
FIG.9 PRIOR ART
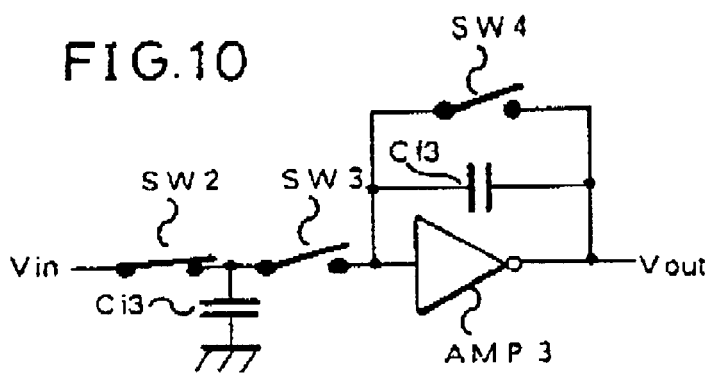
FIG.10
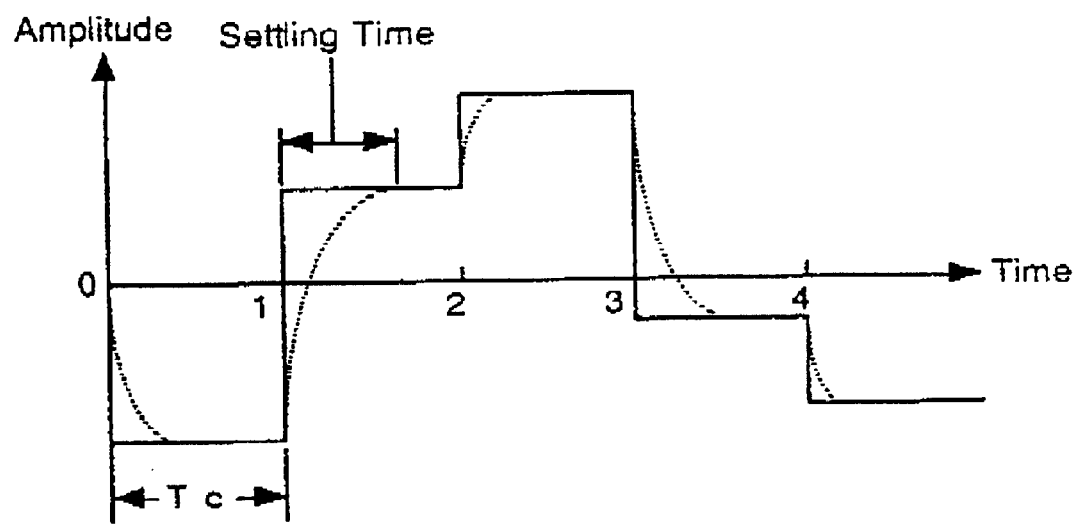
FIG.11

MATCHED FILTER

FIELD OF THE INVENTION

The present invention relates to a matched filter for use in an inverse spread process of a received signal using a spreading signal such as a pseudo-noise (PN) signal in a spread spectrum receiver.

BACKGROUND OF THE INVENTION

Conventionally, as the method of an inverse spread process in a spread spectrum receiver, two methods have been used. One is a passive correlation method which uses a matched filter as inverse spreading means and the other is an active correlation method which uses a correlator as inverse spreading means.

First, the operation of the matched filter will be described. FIG. 6 shows, as an example of the arrangement of the matched filter, a matched filter which uses a spreading signal as a coefficient in an N tap transversal type filter.

In FIG. 6, D(m) and R(m) indicate a received signal and a correlation signal at instant m, respectively. Also, in FIG. 6, N spreading signals P(n) (n=0, 1, ..., N−2, N−1) indicate spreading signals of period N. The received signal D(m) is sampled with respect to time with the period equal to chip section length $T_c$, where $T_c$ is a section length (chip section length) of the spreading signal P(n).

Note that, the value in the brackets of the spreading signal P(n) indicates time so that the larger the value, the further back from the present time. Namely, for example, comparing P(n) and P(n+1), P(n+1) indicates a signal which is further back from P(n) by the amount of time equal to the chip section length $T_c$. On the other hand, the value in the brackets of the other signals such as the received signal D(m) and correlation signal R(m) indicates time so that the smaller the value, the further back from the present time. Namely, for example, comparing D(m) and D(m+1), D(m) indicates a signal which is further back from D(m+1) by the amount of time equal to the chip section length $T_c$.

When the section length (symbol section length) of data to be subjected to a spread process on the sending side is $T_s$, the spread ratio N has the relationship of $N=T_s/T_c$ with the chip section length $T_c$ and symbol section length $T_s$.

As shown in FIG. 6, in a common matched filter, the tap number is equal to the spread ratio N. In the following, for convenience of explaining the operation, the received signal is regarded as a signal within a baseband.

A delay circuit 61 has the structure in which N−1 delay elements 61(p) (p=1, ..., N−2, N−1) are connected in series. To the delay element 61(1) is inputted the received signal D(m). Each delay element 61(p) outputs signal D(m−p). The delay time of each delay element 61(p) is equal to the chip section length $T_c$.

In a multiplier 62(n), the spreading signal P(n) is multiplied with each of the input signal D(m) and the output signal D(m−p) of each delay element 61(p) (i.e., signal D(m−n)), and the result of this multiplication is outputted as a signal. Then, the output signals of all the multipliers 62(n) are added in an adder 63. As a result, a correlation signal R(m) with respect to symbol section length $T_s$, which is the length of one period of the spreading signal P(n), is determined. This is represented by the following equation (1).

$$R(m) = \sum_{n=0}^{N-1} D(m-n) \cdot P(n) \quad (1)$$

A common spreading signal only takes the two values of +1 and −1, and for this reason in a common multiplier 62(n), the polarity of the input of the adder 63 is reversed in accordance with the spreading signal P(n). As is clear from the structure of FIG. 6, in the matched filter, the spreading signal P(n) is fixed, and the cross-correlation function with the received signal D(m), which changes per chip section length $T_c$, is calculated. The absolute value of the correlation signal R(m) becomes maximum at the time when the received signal D(m) and the spreading signal P(n) are in-phase. By the periodicity of the received signal D(m) and the spreading signal P(n), the time of in-phase arrives per symbol section length $T_s$. Thus, it is ensured that the inverse spread using a matched filter is carried out with the period equal to the symbol section length $T_s$. Accordingly, the operation for making a coincidence of the phases of the received signal D(m) and the spreading signal P(n) is not required. For this reason, the inverse spread method using the matched filter is called the passive correlation method.

The following describes the operation of the correlator. FIG. 7 shows an example of the structure of the correlator. First, the products of the received signal D(m) and N spreading signals P(n) (n=0, 1, 2, ..., N−1) are determined in the multiplier 64, and the products are integrated in an integrator 65. The received signal D(m) has been sampled with respect to time, and for this reason in this integration operation, cumulative addition of the products of the received signal D(m) and the spreading signals P(n) is carried out. The correlation signal R(m) of the correlator is represented by the following equation (2).

$$R(m) = \sum_{n=0}^{N-1} D(m-n) \cdot P((n+i) \bmod N) \quad (2)$$

Here, i is an integer in the range of $0 \leq i \leq N-1$ indicating the phase of the spreading signal P(n) at the start of integration, and i is set by a controller 67. "mod" is residual operator.

A spreading signal generator 66 outputs the spreading signal P(n) per chip section length $T_c$. For example, when i=5, and N≧7, the spreading signal generator 66 outputs spreading signal P(4) at instant m−N+1, spreading signal P(3) at instant m−N+2, ..., spreading signal P(0) at instant m−N+5, spreading signal P(N−1) at instant m−N+6, ..., and spreading signal P(5) at instant m.

In this manner, in the above correlator, the integrator 65 performs integration of the product of the received signal D(m) and the spreading signal P(n) for one period (symbol section length $T_s$) of the spreading signal from instant m−N+1 to instant m so as to determine the correlation signal R(m) at instant m as the cross-correlation function of the received signal D(m) and the spreading signals P(n).

Note that, the output of the integrator 65 at the instant other than instant m is the value in calculation of the cross-correlation function in progress, and the length of an integration section does not reach the symbol section length $T_s$, and therefore is called a partial cross-correlation function. In the case where the spread ratio N is significantly large, the length of integration section may be made shorter than the symbol section length $T_s$, and the partial cross-correlation function is used as the correlation signal R(m).

The integrator 65 sets the integrated value which had been accumulated before the start of integration to zero. This operation of making the integrated value to zero is called damping or reset.

In order to carry out the inverse spread process with this correlator, unlike the above matched filter, it is required beforehand to make a coincidence of the phases of the received signal D(m) and the spreading signal P(n). Thus, the phase i of the spreading signal P(n) at the start of integration is controlled by the controller 67. The method using the correlator is called the active correlation method because the operation of actively matching the phases of the received signal D(m) and the spreading signal P(n) is required. Note that, instead of the integrator 65 of the correlator, a low-pass filter may be used.

The operation of actively matching the phases of the received signal and the spreading signal is the synchronism acquisition. In the matched filter, the synchronism acquisition can be carried out with the period equal to the symbol section length $T_s$. On the other hand, in the correlator, the controller 67 determines the integration result (correlation function) with respect to all the phase shift by shifting the phase i of the spreading signal P(n) at the start of integration by one per finish of one integration.

The synchronism acquisition time (time required for synchronism acquisition) of the correlator is the product of period N of the spreading signal P(n) and the integration time, and since the integration time is equal to the symbol section length $T_s$, the synchronism acquisition time is equal to $N \times T_s$. This is N times the synchronism acquisition time of the matched filter. As easily expected, by reducing the integration time shorter than the symbol section length $T_s$, the synchronism acquisition time can be reduced. However, this makes the output of the correlator the partial cross-correlation function, and as the integration time is reduced, the probability of synchronism acquisition failure is increased as a result of decrease in SN ratio of the signal outputted from the correlator. Thus, the integration time cannot be reduced without taking this problem into account.

Note that, such a synchronism acquisition using one correlator is called a serial search, and the correlator used here is called a sliding correlator.

As described, one characteristic of the matched filter is that the synchronism acquisition time is short. However, the matched filter has the problem that the circuit size tends to be large. A digital matched filter in particular poses this problem by the size of the adder 63, which is a multi-input adder. The multi-input adder can only be realized by the combination of two-input adders. Thus, when the tap number is N, at least N−1 two-input adders are required, and for this reason as the tap number is increased, the circuit size of the adder 63 is also increased. Also, because a high-speed operation is required as the chip section length $T_c$ becomes shorter, the problem of increased power consumption is presented.

To solve these problems, an analog matched filter using an inverting amplifier has been catching attention. An example of this matched filter is disclosed in Japanese Unexamined Patent Publication No. 46231/1997 (Tokukaihei 9-46231) (published date Feb. 14, 1997). However, in the matched filter of this invention, when the tap number N becomes large, the problem of increased circuit size of the adder is presented.

FIG. 8 shows a schematic diagram of the adder disclosed in the above publication. In this adder, the number of inputs is N. Each input Vin(n) (n=0, 1, ... , N−1) is connected to the input of the inverter amplifier AMP1 via a capacitor C(n). The output of the inverter amplifier AMP1 is feed-backed to the input of the inverter amplifier AMP1 via a capacitor Cf1. Thus, the output voltage Vout has the value which is the sum of inputs Vin(n) amplified by (c(n)/cf1). Note that, c(n) indicates the capacitance of the capacitor C(n) and cf1 indicates the capacitance of the capacitor Cf1.

Also, in the above adder, in order to have the function of the multiplier 62(n) of FIG. 6, two signals corresponding to the polarity of the spreading signals are added in advance, and the difference between these signals added together is determined. Also, because the number of inputs of the adder is limited by the driving power of an internal amplifier of the inverting amplifier, to constitute the adder 63 of FIG. 6, the adder of FIG. 8 needs to be used in plurality. Also, in the case that the analog matched filter is realized by LSI, it is required to make the capacitors of the adder large to some degree to reduce the adverse effects of various parasitic capacitance. Particularly, when the tap number is increased, the number N of the input capacitor C(n) of the amplifier AMP1 is also increased, and as a result the circuit size of the analog matched filter is increased. Further, when the tap number is large, the number N−1 of the delay elements 61(p) is also increased.

In each delay element 61(p), a sample/hold circuit is used. Each sample/hold circuit requires a capacitor for storing charge, and at least one amplifier for outputting the stored charge as a voltage without discharge. As an example, FIG. 9 schematically shows the sample/hold circuit used in the invention of the above publication.

The sample/hold circuit has an input as the inputs of the adder as shown in FIG. 8, and additionally a switch SW1. The input resistance of an inverting amplifier AMP 2 is extremely high so that the current flowing into the input of the amplifier AMP2 is negligible.

While the switch SW1 is closed (in sample section), input signal Vin is amplified by (−Ci2/Cf2) by an inverting amplifier composed of the amplifier AMP2 and the capacitors Ci2 and Cf2 and the amplified input signal Vin is outputted as output signal Vout from the inverting amplifier. While the switch SW1 is open (in hold section), the input signal Vin immediately before the switch SW1 opens is kept held by the capacitor Ci2, and thus (−Ci2/Cf2) times the input signal Vin is kept outputted as output signal Vout. When the analog matched filter is realized by LSI, as with the adder of FIG. 8, the capacitors Ci2 and Cf2 of the sample/hold circuit also need to have large capacitance. Therefore, the circuit size of the analog matched filter is also increased as a result.

Further, in the analog circuit, the settling time also presents a problem. As described, the received signal D(m) is sampled with respect to time. FIG. 11 shows an example of a waveform which has been sampled with respect to time. The ordinate and abscissa represents time and amplitude, respectively. The scale and numbers on ordinate indicate sampling instant. The sampling period is $T_c$. The waveform indicated by the solid line is the waveform with ideal sampling with respect to time, and a constant amplitude value is maintained between sampling instants. In the actual analog circuit, it takes some time to charge and discharge the capacitor. Thus, even when the input signal is ideal, the output cannot keep up with the abrupt amplitude change at the sampling instant, and it takes some time before the output reached a constant amplitude value, as shown by the waveform indicated by the broken line. The time it takes from the sampling instant to the time at which the output reaches the constant amplitude value is the settling time. The output of the adder 63 is the cross-correlation function so that it changes dynamically per instant. Namely, the problem of long settling time is presented by the fact that the amplitude fluctuation is large. When the settling time becomes longer than the sampling period length $T_c$, the matched filter cannot output accurate values.

To prevent this problem, the method of reducing the settling time of the adder of FIG. 8 and the sample/hold circuit of FIG. 9 comes to light. However, this method increases the current consumed by the amplifier. This is caused by the fact that the slew rate, which basically determines the settling time, is proportional to the bias current of the amplifier. The larger the slew rate, the shorter the settling time. The bias current of the amplifier becomes the current consumed by the amplifier. Thus, to reduce the settling time, it is required to increase the current consumed by the amplifier. The matched filter by design includes large numbers of delay elements and amplifiers in the adder constituting the matched filter, and thus when the current consumed by the amplifier is increased, the current consumed by the entire matched filter is increased notoriously.

Meanwhile, in the correlator, the degree of the adverse effect the magnitude of the spread ratio has on the circuit size is far smaller than the case of the matched filter. Yet, in a serial search which uses the correlator for synchronism acquisition, the problem of long acquisition time remains. To solve this problem, a parallel search which uses a plurality of correlators connected in parallel (parallel correlators) is available.

Japanese Unexamined Patent Publication No. 88526/1991 (Tokukaihei 3-88526) (published date Apr. 12, 1991) and Japanese Unexamined Patent Publication No. 125668/1989 (Tokukaihei 1-125668) (published date May 18, 1989) disclose this parallel search. In the technique disclosed in these publications, each of the parallel correlators carries out serial search, and for this reason the acquisition time is reduced by the inverse of the number of correlators provided, compared with the case of the serial search which uses only one correlator. However, as with the serial search, the parallel search is the active correlation method. Therefore, there is a problem that it is required to provide means for controlling the phase of the spreading signal inputted to the correlator.

Also, in the case of realizing the correlator by the analog circuit, the damping time may pose a problem.

In the output of the integrator of the correlator, the output fluctuation per instant is small, and accordingly the settling time is short. This is because the amplitude of the output of the integrator when the phases of the spreading signal and received signal coincide is simply increased or reduced as a partial cross-correlation function, and its absolute value takes the maximum value at the time the cross-correlation function is outputted. This maximum value is required to be a level which does not saturate as the integrator output, and therefore the increment (decrement) of the integrator output per instant need to be reduced.

On the other hand, in damping, the integration result, which became maximum when the phases of the spreading signal and received signal coincide, needs to be set to zero, and for this reason the settling time becomes long. In the serial search, in general, a single search is carried out in one symbol section $T_s$ including this long damping time.

Thus, while the integration section can be reduced, it is prone to the problem that the SN ratio of the correlator output is reduced.

As disclosed in Japanese Unexamined Patent Publication No. 181345/1989 (Tokukaihei 1-181345) (published date Jul. 19, 1989), the method in which two correlators are used, and in which while one correlator carries out integration and the other correlator carries out damping has been available. However, in the parallel search using parallel correlators, when each correlator is realized by two correlators, the problem of large circuit size is presented. As described above, to reduce the settling time, the current consumed by the amplifier in the integrator is increased. However, because the number of amplifiers is large in parallel correlators, the problem is presented that the entire current consumed is increased notoriously.

SUMMARY OF THE INVENTION

An object of the present invention is to provide a matched filter with a small circuit size and low power consumption.

In order to achieve the above object, a matched filter of the present invention for inversely spreading a received signal using spreading signals in a spread spectrum communications receiver includes: a plurality of correlators for determining cross-correlation functions of the same received signal which has been sampled at a certain timing and spreading signals having a certain section length; a spreading signal delaying section for successively transferring the spreading signals having a certain section length with respect to the plurality of correlators by delaying a timing of transfer by a period equal to the section length of the spreading signals; and a selecting section for successively selecting one of the cross-correlation functions outputted from the plurality of correlators by a period equal to a sampling interval of the received signal.

In the matched filter of the present invention, the plurality of correlators operate in parallel, and to each of the plurality of correlators from the spreading signal delaying section are inputted spreading signals of different phases which are shifted from one another by a period equal to the section length of the spreading signal. Thus, the phases of the received signal and spreading signal coincide in one of the plurality of correlators.

The spreading signal delaying section for supplying the plurality of spreading signals of different phases can be realized by simple delay circuits, and it is not required to provide a circuit for controlling the phase of the spreading signals, which is necessary in the active correlation method such as a parallel search using parallel correlators, thus reducing circuit size.

In the case of realizing the matched filter of the present invention by an analog circuit, unlike the conventional matched filter of a transversal type, it is required to provide the selecting section, such as a multiplexer, which selects one input from plural inputs. However, because a multi-input adder is not required, the circuit size can be reduced by the size of this circuit.

Further, by increasing the number of correlators larger than a spread ratio, the damping time can be extended, thereby reducing power consumption.

Also, in the matched filter of the present invention, by extending the integration time, the cumulative process of the matched filter output can be carried out without a post-process which is required in a conventional matched filter.

Furthermore, as with the conventional matched filter of a transversal type, the matched filter of the present invention is applicable to an oversampled received signal, a long code spreading signal, and switching of the spreading signal, and therefore is capable of replacing the conventional matched filter of a transversal type in virtually all applications such a matched filter is used.

For a fuller understanding of the nature and advantages of the invention, reference should be made to the ensuing detailed description taken in conjunction with the accompanying drawings.

BRIEF DESCRIPTION OF THE DRAWINGS

FIG. 1 is a block diagram showing a schematic structure of a matched filter in accordance with one embodiment of the present invention.

FIG. 6 is a schematic block diagram showing one example of a conventional matched filter.

FIG. 7 is a schematic block diagram showing one example a conventional correlator.

FIG. 8 is a schematic block diagram showing one example of an adder used in a conventional analog matched filter.

FIG. 9 is a schematic block diagram showing one example of a sample/hold circuit used in a conventional analog matched filter.

FIG. 10 is a schematic block diagram showing one example of an integrator used in an analog correlator.

FIG. 11 is a waveform diagram explaining a settling time in an analog circuit.

DESCRIPTION OF THE EMBODIMENTS

[First Embodiment]

Figure 2:
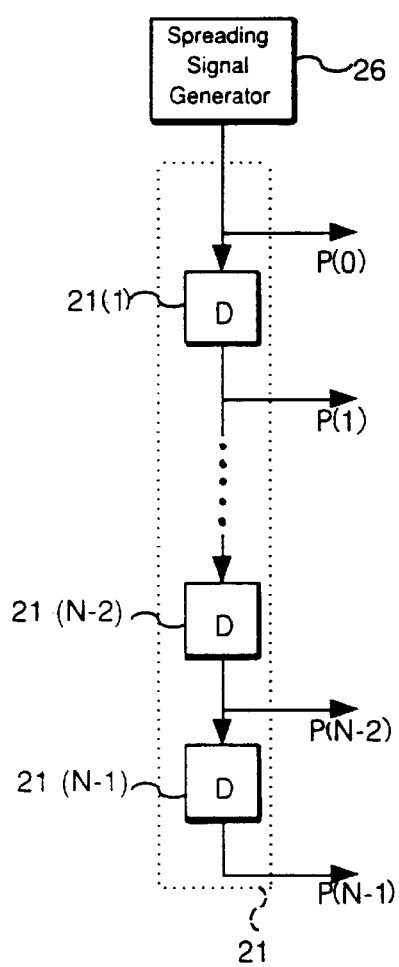
FIG. 2 is a schematic block diagram showing a delay circuit of a matched filter in accordance with another embodiment of the present invention.

The following will describe one embodiment of the present invention referring to FIG. 1.

Note that, in the present embodiment, a tap number of a matched filter is equal to a spread ratio in spread spectrum communications. A matched filter whose tap number is not equal to the spread ratio will be described later in other embodiments of the present invention. Here, the tap number of the matched filter indicates the number of correlators connected to one another in parallel.

Also, the present embodiment describes the case where there is only one kind of spreading signals. The spreading signals of plural types will be described later in the other embodiments. The matched filter of the present embodiment is for inversely spreading a received signal which has been subjected to a usual sampling (sampling with an interval equal to a section length of spreading signals) using spreading signals in a spread spectrum communications receiver.

As shown by a block diagram of FIG. 1, the matched filter of the present embodiment has N tap number and N spread ratio (where N is a natural number), and includes a delay circuit 11 as spreading signal delaying means, N correlators 12(n) (correlator 12) as correlating means, and a multiplexer 15 as selecting means. Note that, n falls in an integer group which satisfies $0 \leq n \leq N-1$, namely n indicates 0, 1, ..., N−2, N−1.

The following describes each component of the matched filter.

The delay circuit 11 transfers spreading signals P(n) of a certain section to the correlators 12(n) by successively delaying the timing of transfer by a chip period $T_c$ (time equal to the section length of the spreading signals P(n)) such that a plurality of spreading signals P(n) with different phases are given to the correlators 12(n), respectively.

Note that, the spreading signals P(n) change per section from P(N−1), P(N−2), ..., P(1), P(0) in this order, and this change is repeated with period N (N times the section length). A received signal D(m) is sampled by the same period as the section length (chip section length $T_c$) of the spreading signals P(n) with respect to time. Note that, the values in the brackets of the received signal D and of output R of a cross-correlation function (to be described later) are integers which indicate the instant of sampling by a unit of chip section length $T_c$, and the smaller the value, the further back from the present time.

The delay circuit 11 has the structure in which delay elements 11(n) (storing means) provided in the same numbers as the number N of the spreading ratio are connected in series in the form of a ring, i.e., to form a loop. Each delay element 11(n) stores the spreading signal P(n), and successively sends the spreading signal P(n) to an adjacent delay element 11(n) per period equal to chip period $T_c$.

In FIG. 1, at instant m, a delay element 11(0) stores the spreading signal P(0), a delay element 11(1) stores the spreading signal P(1), ..., and a delay element 11(N−1) stores the spreading signal P(N−1). At the next instant m+1, the delay element 11(0) stores the spreading signal P(N−1), the delay element 11(1) stores the spreading signal P(0), ..., and the delay element 11(N−1) stores the spreading signal P(N−2). Note that, the "instant" indicates the time when the chip period $T_c$ is one.

As with the delay elements 11(n), the correlators 12(n) are also provided in the same numbers as the tap number N. To each correlator 12(n) is inputted the same received signal (received signals which were sampled at the same timing) D(m) and the spreading signal P(n) which is the output of the delay element 11(n). The correlators 12(n) operates in parallel to determine cross-correlation functions of the same received signal D(m) and the spreading signals P(n) of a certain section, and the cross-correlation functions thus determined are outputted as output r(m, n) to the multiplexer 15. In the delay elements 11(n) adjacent to each other are stored spreading signals which are off-phase from each other by one instant, and thus to the correlators 12(n) adjacent to each other are inputted the spreading signals which are off-phase from each other by one instant.

Each correlator 12(n) includes a multiplier 13(n) (multiplier 13) as multiplying means and an integrator 14(n) (integrator 14) as integrating means. In each correlator 12(n), the multiplier 13(n) determines the product of the spreading signal P(n), which is the output of the delay element 11(n), and the received signal D(m), and the integrator 14(n) performs integration of the product thus determined.

The integrator 14(n) of the correlator 12(n) to which the spreading signal P(0) was inputted performs damping immediately before the next input of the spreading signal P(0). Namely, each integrator 14(n) performs damping when the integration of one period (=symbol section length $T_s$) of the spreading signals is finished. The output r(m, n) of each correlator 12(n) at the instant m of FIG. 1 is represented by the following equation (3).

$$r(m, n) = \sum_{j=n}^{N-1} D(m+n-j) \cdot P(j) \qquad (3)$$

Namely, at the instant m in FIG. 1, only the correlator 12(0) performs integration of the spreading signals P(0) to P(N−1) of one period. That is, only the output r(m, 0) of the correlator 12(0) is the cross-correlation function of the received signal D(m) and the spreading signal P(n). The correlator 12(1) outputs the cross-correlation function of the spreading signals P(0) to P(N−1) and the received signal D(m), the correlator 12(2) outputs the cross-correlation function of the spreading signals P(2) to P(N−1) and the received signal D(m), . . . , and the correlator 12(N−1) outputs the cross-correlation function of only the spreading signal P(N−1) and the received signal D(m). Namely, the correlators 12(1) to 12(N−1) output partial cross-correlation function of the received signal D(m) and the spreading signals P(n). The multiplexer 15 receives the outputs r(m, 0) to r(m, N−1) of all the correlators 12(0) to 12(N−1), and selects and outputs as a correlation signal R(m) the output of the correlator 12(n) (here correlator 12(0)) to which the spreading signal P(0) has been inputted.

In the present embodiment, the multiplexer 15 selects the output of the correlator 12(0), and the output R(m) of the multiplexer 15 becomes equal to r(m, 0). The integrator 14(0) of the correlator 12(0) whose output r(m, 0) has been selected performs damping immediately before the next instant m+1.

At the instant m+1, only the correlator 12(1) performs integration of the spreading signal of one period. Also, because the received signal to be multiplied with the spreading signal P(0) is D(m+1) at the instant m+1, the phase relationship between the received signal and the spreading signal is shifted by one (chip period $T_c$) from the instant m at which the received signal multiplied with the spreading signal P(0) is D(m).

The multiplexer 15 selects the output r(m+1, 1) of the correlator 12(1), which is the output of the cross-correlation function, and outputs a correlation signal R(m+1). The integrator 14(1) of the correlator 12(1) which has been selected performs damping immediately before the next instant m+2.

Namely, the integrator 14(0) and integrator 14(1) respectively perform damping with the period by which the output R(m+1) and output R(m+2) are selected by the multiplexer 15. In the same manner, damping is carried out with respect to all the integrators 14(n) with the period by which the multiplexer 15 selects the cross-correlation function outputted from the correlator 12(n), namely, with the period equal to the product of the sampling interval of the received signal D(m) and the number N of the correlators 12(n).

In this manner, the multiplexer 15 successively selects and outputs one of the outputs r(m, n) of the correlators 12(n) for each period equal to the chip period $T_c$ (namely, for each period equal to sampling interval), and at instant m+N−1, r(m+N−1, N−1) is outputted as the output R(m+N−1). Also, the multiplexer 15 at instant m+N outputs again the output r(m+N, 0) of the correlator 12(0). Namely, the output of each correlator 12(n) is outputted via the multiplexer 15 per N instant corresponding to the number of correlators 12(n), that is, per period equal to the product of the sampling interval (equal to chip period $T_c$) and the number N of the correlators 12(n).

Correlators 12(n) successively calculate the cross-correlation functions of the received signal D(m) and the spreading signals P(n), which are shifted per chip period $T_c$, and because the number of correlators 12(n) is equal to the spread ratio N, and because the same spreading signal P(n) is not inputted to each correlator 12(n) simultaneously, it is ensured that at any instant one of the correlators 12(n) outputs the cross-correlation function and the multiplexer 15 selects the cross-correlation function thus outputted.

In the arrangement of the present embodiment, the output R(m) of the multiplexer 15 satisfies the equation (1), and therefore the matched filter of the present embodiment can operate in a manner similar to the conventional matched filter of a transversal type as shown in FIG. 6. In other words, the arrangement of the present embodiment is capable of an inverse spread process by the passive correlation method. Therefore, the received signal D(m) and the spreading signal P(n) always become in-phase per symbol section length $T_s$ by their periodicity, and the operation of making a coincidence of the received signal D(m) and the spreading signal P(n) is not required. Thus, the arrangement of the present embodiment does not require means for controlling the phases of spreading signals, such as parallel correlators used in a parallel search of the conventional active correlation method, and the circuit structure can be simplified compared with the parallel correlators used in the parallel search.

Also, in the matched filter of the present embodiment provided with the same numbers of correlators 12(n) as the tap number, unlike the matched filter of a transversal type as shown in FIG. 6, a delay circuit for storing the received signal D(m) is not required. Also, a multi-input adder for performing addition of products of the received signal D(m) and the spreading signals P(n) is not required either. Here, the number of correlators and the number of sample/hold circuits as a delay circuit are both equal to the tap number N, as compared with respect to their circuit size in an analog circuit.

The integrator 14(n) of the correlator 12(n) can be realized, for example, by the integrator having the circuit structure as shown in FIG. 10. The integrator of FIG. 10 includes capacitors Ci3 and Cf3, switches SW2, SW3, and SW4, and an inverting amplifier AMP3.

The input terminal of the integrator to which input voltage Vin is inputted is connected to one terminal of the capacitor Ci3 via the switch SW2, and to the input of the inverting amplifier AMP3 via the switch SW3. The other terminal of the capacitor Ci3 is grounded. The terminals of the capacitor Cf3 are connected to the input and output of the inverting amplifier AMP3, respectively.

The output of the inverting amplifier AMP3 is connected to the output terminal of the integrator from which output voltage Vout is outputted. The inverting amplifier AMP3 has infinite input resistance and the input of zero potential (virtual ground).

Between the input and output of the inverting amplifier AMP3 is connected the switch SW4 parallel to the capacitor Cf3. The switch SW4 is a damping switch and discharges the charge stored in the capacitor Cf3 when closed. The switches SW2 and SW3 are provided such that one opens when the other is closed and do not close simultaneously.

In this integrator, input voltage Vin is stored in the capacitor Ci3 when the switch SW2 is closed and the switch SW3 is open. Then, when the switch SW2 opens and the switch SW3 is closed, the charge stored in the capacitor Cf3 is kept accumulated by the operation of the switches SW2 and SW3 unless discharged by the switch SW4. The integration of input voltage Vin with respect to time is performed in this manner, and the integrated value is outputted as output voltage Vout.

In the sample/hold circuit of FIG. 9 used in the conventional matched filter of a transversal type, although not shown, it is required to provide a switch on the both terminals of a capacitor Cf2 to release the charge remaining or flown into the input terminal of an amplifier AMP2. Thus, this sample/hold circuit has the circuit size which is substantially the same as that of the integrator as shown in FIG. 8. Thus, the matched filter of a parallel correlator type of the present embodiment can be made smaller by the size of the multi-input adder than the matched filter of a transversal type as shown in FIG. 6.

In the present embodiment, a low-pass filter may be used instead of each integrator $14(n)$. In such a case, damping is not required.

In the synchronism acquisition of a receiver used in a phasing environment in which a direct wave from the antenna of a transmitter cannot be received, instead of deciding the phase difference between the received signal D(m) and the spreading signals P(n) only by the output of the matched filter of one symbol section length, to increase the SN ratio of the output of the matched filter, the output of the matched filter which has been averaged over several symbol sections is used.

The average of the output of the matched filter is determined by adding (accumulating) cross-correlation functions which are separated from one another by N instant (i.e., cross-correlation function per symbol period), and by dividing the added value by the number of additions. When the number of additions is always constant, division is not required. This averaging or accumulation is generally carried out in a process after the process in the matched filter.

In the present embodiment, the period of carrying out damping by each integrator $14(n)$ is set to be several times the symbol period, i.e., L times (where L is not less than 2) the period by which the multiplexer 15 selects the output of each correlator $12(n)$, so as to average the outputs of the matched filter. That is, integration is continuously carried out in the correlator $12(n)$ by not carrying out damping over the adding section. Damping is carried out immediately after the adding section. The outputs of correlators $12(n)$ are successively selected by the multiplexer 15 to be the output of the matched filter, thus outputting the result of accumulation which was obtained before damping. Note that, in this case, it is required to increase the dynamic ranges of the integrators $14(n)$ so that the output does not saturate.

[Second Embodiment]

The following will describe another embodiment of the present invention referring to FIG. 2.

Incidentally, the product of a short code having a short period and a long code having a long period is sometimes used as the spreading signal. In such a case, generally, the period of the short code corresponds to the spread ratio, and the period of the long code is far longer than the spread ratio. In the case of using a spreading signal with a combination of these two codes in a matched filter, because the period of this combined spreading signal is equal to the period of the long code, in a delay circuit composed of delay elements provided in the same numbers as the spread ratio, it is impossible to store all the spreading signals.

In order to use the spreading signal composed of these two codes, a matched filter of the present embodiment uses, as signal delaying means, a delay circuit 21 having the structure as shown in FIG. 2, instead of the delay circuit 11, in the matched filter of FIG. 1. Note that, the components of the matched filter of the present embodiment, other than the delay circuit 21 and a spreading signal generator (described later) 26, have the same arrangements and functions as that of the First Embodiment, and the explanations thereof are omitted here.

As shown in FIG. 2, the delay circuit 21 has the structure in which delay elements $21(p)$ provided in the number one less than the spread ratio N (=N−1) are connected to one another in series. Note that, p falls in an integer group which satisfies $1 \leq p \leq N-1$, namely p indicates $1, \ldots, N-2, N-1$. Also, as with the delay elements $11(n)$, delay elements $21(1)$ to $21(N-2)$ successively send the spreading signal P(n) to adjacent delay elements $21(2)$ to $21(N-1)$ per period equal to the chip period $T_c$.

The delay elements $21(n)$, unlike the delay elements $11(n)$, are not a ring. Namely, the delay elements $21(p)$ are provided such that the output of the delay element $21(p)$ on the last stage (delay element $21(N-1)$) is not connected to the input of the delay element $21(p)$ on the first stage (delay element $21(1)$), and therefore are not in the form of a loop. Thus, it is required to generate and supply a spreading signal P(0) to the delay element $21(1)$ on the first stage.

In the present embodiment, there is provided the spreading signal generator (spreading signal generating means) 26 for generating and supplying the spreading signal P(0) to the delay element $21(1)$ on the first stage. The spreading signal generator 26 generates the short code and long code, and determines their product to generate the spreading signal P(0). Also, the spreading signal generator 26 sends the spreading signal P(0) to the delay circuit 21 per chip period $T_c$. Meanwhile, the circuits including the delay circuit 21, excluding the spreading signal generator 26, carry out the same operation as the delay circuit 11 of the First Embodiment, realizing a matched filter operation compatible with the long code. Note that, each integrator $14(n)$ performs damping after the integration of one short code period is finished and before the next instant.

The matched filter using the delay circuit 21 is equally effective even when the period of the spreading signal made up of the short code alone is long, that is, even when the spread ratio is significantly large. In such a case, the tap number of the matched filter, i.e., the number of correlators is made smaller than the spread ratio. Note that, the outputs of the matched filter are all partial cross-correlation functions in an integration range which corresponds to the tap number.

[Third Embodiment]

Figure 3:
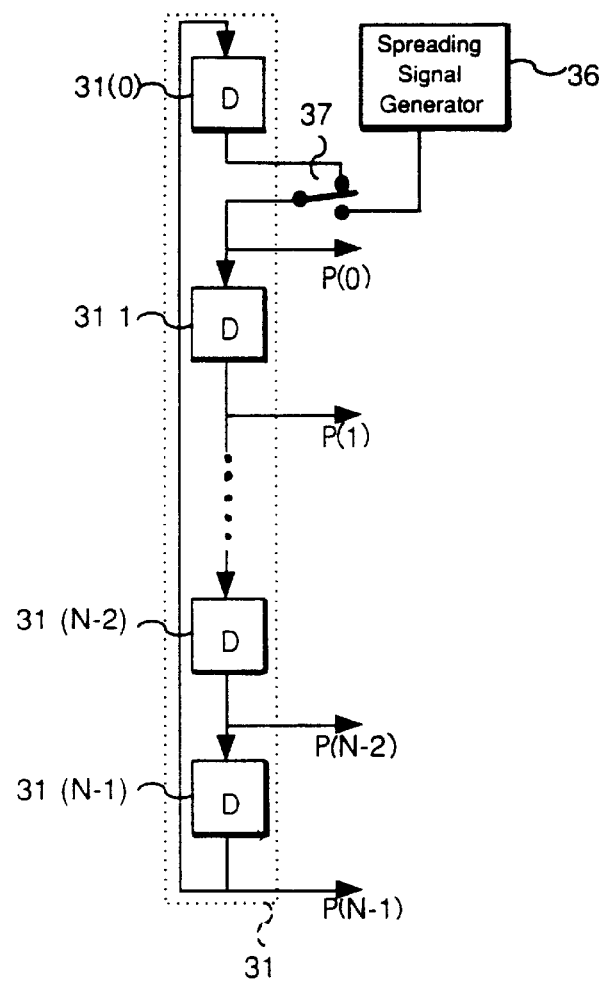
FIG. 3 is a schematic block diagram showing a delay circuit of a matched filter of yet another embodiment of the present invention.

The following will describe yet another embodiment of the present invention referring to FIG. 3.

In a matched filter of the present embodiment, when there are several kinds of spreading signals, after operating the matched filter with a single spreading signal, in order to use a different spreading signal in the same matched filter, a delay circuit 31 as shown in 3 is used as the spreading signal delaying means in the matched filter of FIG. 1, instead of the delay circuit 11. Note that, the components of the matched filter of the present embodiment, other than the delay circuit 31, have the same arrangements and functions as that of the First Embodiment, and the explanations thereof are omitted here.

The delay circuit 31 has the structure in which a spreading signal generator (spreading signal generating means) 36 similar to the spreading signal generator 26, and a switch (input means, switching means) 37 are inserted between the delay element $11(0)$ and delay element $11(1)$ of the delay circuit 11.

In the delay circuit 31, N delay elements $31(n)$ as storing means are connected in series from a delay element $31(1)$, $31(2), \ldots, 31(N-2), 31(N-1)$, and $31(0)$ in this order, and as the input of the delay element $31(n)$ of the first stage, i.e., the delay element $31(1)$, either one of the output of the delay element $31(0)$ and the output of the spreading signal generator 36 is selected by the switch 37.

Usually, the switch 37 selects the output of the delay element 31(0), i.e., the spreading signals (first series of spreading signals) outputted from the delay element 31(0) so as to connect the delay elements 31(n) in series in the form of a ring. As a result, the delay circuit 31 operates in the same manner as the delay circuit 11 of FIG. 1, and the matched filter operates in the same manner as the matched filter of FIG. 1.

When using another spreading signals (second series of spreading signals), the switch 37 selects the output of the spreading signal generator 36 from the next instant of the instant at which the cross-correlation function r(m, 0) is outputted from the correlator 12(0) to allow the spreading signal generator 36 to output the spreading signal to the delay element 31(1) per instant, and after outputting the spreading signals P(n) of one period, selects again the output of the delay element 11(0). In this way, the matched filter can operate without interruption even when switching the spreading signals. Note that, the cross-correlation function with respect to new spreading signals (another signal) is outputted at the instant when other spreading signals of one period are outputted from the spreading signal generator 36.

[Fourth Embodiment]

As a rule, the matched filter in use receives a received signal which has been oversampled. Namely, in general, the actual received signal is sampled with 1/K times (where K is an integer of not less than 2) the chip period length $T_c$.

In such a case, the output of an N tap matched filter is represented by the following equation (4), where D(k−nK) is the received signal and R(k) is the correlation signal.

$$R(k) = \sum_{n=0}^{N-1} (D(k-nK) \cdot P(n)) \quad (4)$$

However, it should be noted here that k is the instant in oversampling, and it has the relationship of k=m·K+g (0≦g≦K−1) with the usual sampling instant m. From the equation (4), the output of the matched filter is the cross-correlation functions of the received signal P(n) and the spreading signals, from instant k to instant k−nK (n=0, 1, . . . , N−1). Note that, n falls in an integer group which satisfies 0≦n≦N−1, namely n indicates 0, 1, . . . , N−2, N−1. Also, an instant is the time when the usual sampling interval, i.e., the chip period length $T_c$ is one.

Figure 4:
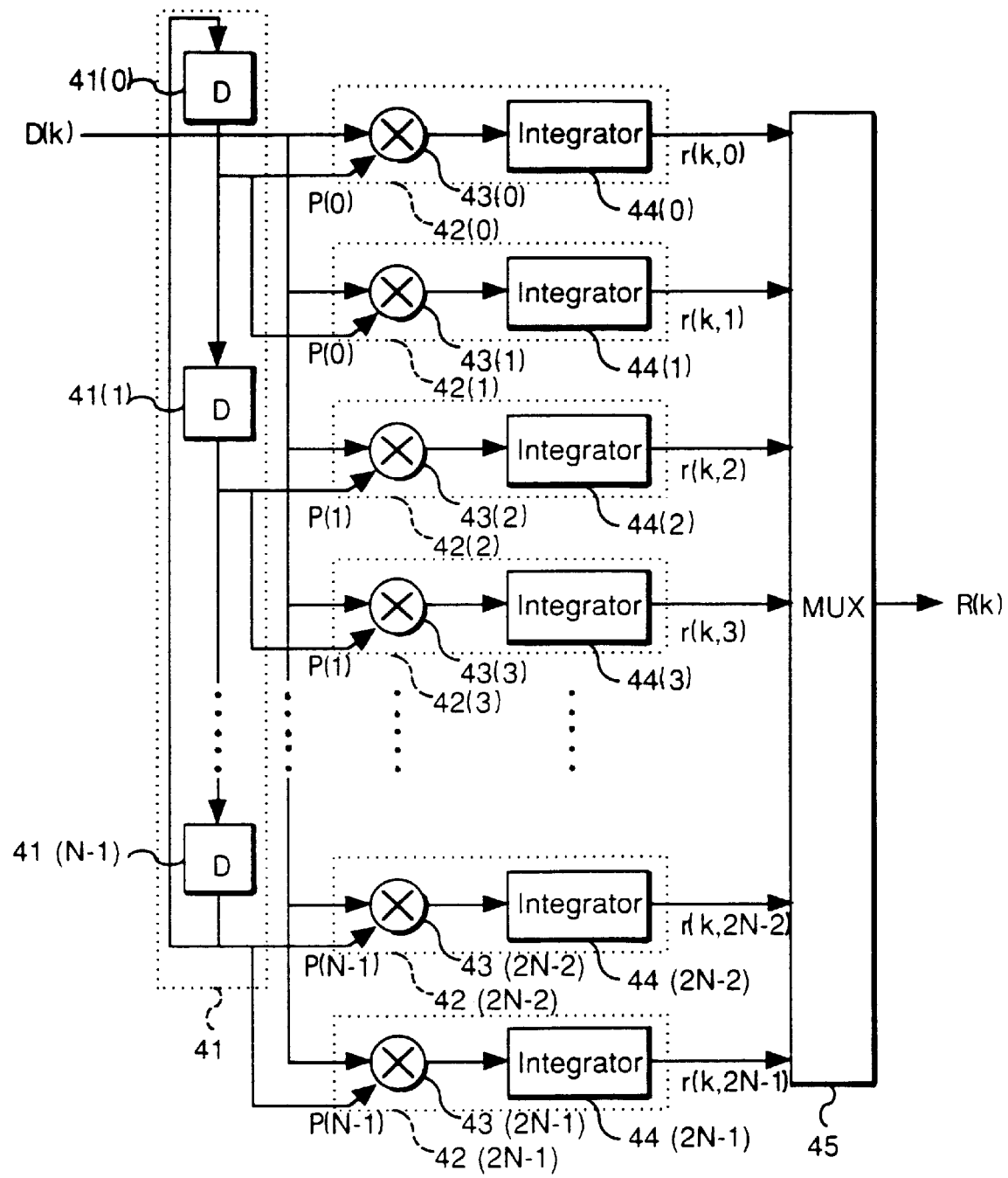
FIG. 4 is a schematic diagram showing an oversampling compatible matched filter in accordance with still another embodiment of the present invention.

The following describes as still another embodiment of the present invention an oversampling matched filter for inversely spreading a received signal which has been oversampled (sampling with an interval equal to 1/K times the section length of the spreading signals) using spreading signals in a spread spectrum communications receiver, referring to FIG. 4. Here, the explanation is based on the case where K is 2, yet K is not just limited to this.

The N tap oversampling matched filter in accordance with the present embodiment, as shown in FIG. 4, has N tap number and N spread ratio (where N is a natural number), and includes a delay circuit 41 as spreading signal generating means, N×K correlators 42(nd) as correlating means, and a multiplexer 45 as selecting means. Note that, nd falls in an integer group which satisfies 0≦nd≦K·N−1, namely, here, nd indicates 0, 1, . . . , 2N−2, and 2N−1.

The following describes each component of the matched filter.

The delay circuit 41 has the structure in which delay elements 41(n) (storing means) provided in the same number as the spread ratio N are connected in series in the form of a ring. Each delay element 41(n) stores the spreading signal P(n), and sequentially sends the spreading signal to an adjacent delay element 41(n) per usual sampling period $T_c$. In FIG. 4, at instant k, the delay element 41(0) stores the spreading signal P(0), the delay element 41(1) stores the spreading signal P(1), . . . , and the delay element 41(N−1) stores the spreading signal P(N−1). At instant k+K after the chip section length $T_c$ from the instant k, the delay element 41(0) stores the spreading signal P(N−1).

The correlators 42(nd) are provided in the number K times the spread ratio N, and there are provided N groups of K correlators 42(nd), to which the same spreading signal P(n) is inputted from the same delay element 41(n). Each correlator 42(nd) outputs a correlation output r(k, nd).

Each correlator 42(nd) includes a multiplier 43(nd) as multiplying means, and an integrator 44(nd) (integrator 44) as integrating means.

The output of a single delay element 41(n) is connected to the input of K multipliers 43(K·n) to 43(K·n+K−1). In FIG. 4, the output of the delay element 41(0) is connected to the input of the multipliers 43(0) and 43(1), and the output of the delay element 41(1) is connected to the input of the multipliers 43(2) and 43(3). To the other input of the multipliers 43(nd) is inputted a received signal D(k). However, the multipliers 43(nd) actually multiplies the received signal D(k) and the integrator 44(nd) carries out integration only when the following relationship is satisfied at instant k.

$$k \bmod K = nd \bmod K \quad (5)$$

The following describes a specific operation of the matched filter referring to FIG. 4.

First, at instant k, k mod 2=0. Thus, at this instant k, while the correlators 42(0), 42(2), . . . , and 42(2N−2) carry out integration using the inputted received signal D(k), the correlators 42(1), 42(3), . . . , 42(2N−1) do not carry out integration of input signal D(k) despite the fact that the received signal D(k) is inputted.

Conversely, at instant k+1, while the correlators 42(1), 42(3), . . . , 42(2N−1) carry out integration using inputted received signal D(k+1), the correlators 42(0), 42(2), . . . , and 42(2N−2) do not carry out integration of the input signals using the received signal D(k+1).

Damping is carried out after the input of the spreading signal P(0) is made and before the next input signals are integrated by the integrator 44(n) of each correlator 42(n) which has integrated the previous input signals. Namely, damping by each integrator 44(n) is carried out after the integration of the spreading signals P(n) of one period is finished.

In this manner, each correlator 42(nd) carries out integration per K instant, and there is a phase shift of one instant between adjacent correlators 42(nd). Namely, although each correlator 42(nd) operates with the usual sampling period $T_c$ as with the correlator 11(n) of FIG. 1, as a whole, the correlators 42(0), 42(2), . . . , 42(2N−2), and 42(2N−1) output the cross-correlation function as a correlation output with the oversampling period of $T_c/K$.

The multiplexer 45 takes the outputs of all the correlators 42(nd) as inputs, and selects and outputs the output r(k, nd) of the correlator 42(nd) outputting the cross-correlation function. The multiplexer 45 successively selects one of the cross-correlation functions outputted from correlators 42(nd), per period equal to the product of the oversampling period (sampling interval) $T_c/K$ and the number N of the correlators 12(n) and for the duration equal to the section length 1/K of the spreading signal P(n), i.e., the sampling interval of the received signal D(k). As a result, correlation signals R(k) which satisfy the equation (4) are obtained.

In the case where the oversampling matched filter of the present embodiment is made compatible with the long code, as with the delay circuit 21 of FIG. 2, instead of making the delay elements 41(*n*) of the delay circuit 41 in the form of a ring, the spreading signal generator is additionally provided. In the case of adopting the delay circuit 21 of FIG. 2, provided that the spread ratio N is large enough, the tap number may be made smaller than the spread ratio N. Also, as with the delay circuit 21 of FIG. 2, the delay circuit 31 of FIG. 3 is also applicable to the oversampling matched filter of the present embodiment.

[Fifth Embodiment]

In the case of realizing the matched filters of the described embodiments by an analog circuit, the damping time may pose a problem. Namely, the problem is presented by the fact that a series of processes before damping, from integration, then outputting of the result of integration to the multiplexer, and to reading of the output of the multiplexer as a matched filter output by an external circuit (for example, A/D converter), must be confined within time $T_c$ between instant m and the next instant m+1. As mentioned above, the settling time at the time of damping in the integrator of the correlator is longer than the settling time of the integration output. To shorten the settling time, generally, the power consumption of the amplifier in the integrator is necessarily increased. However, when the power consumption of the amplifier is increased to confine the above series of processes in time $T_c$, including the settling time of damping, the power consumption of the entire matched filter of the described embodiments is also increased by the amount of the number of integrators.

Figure 5:
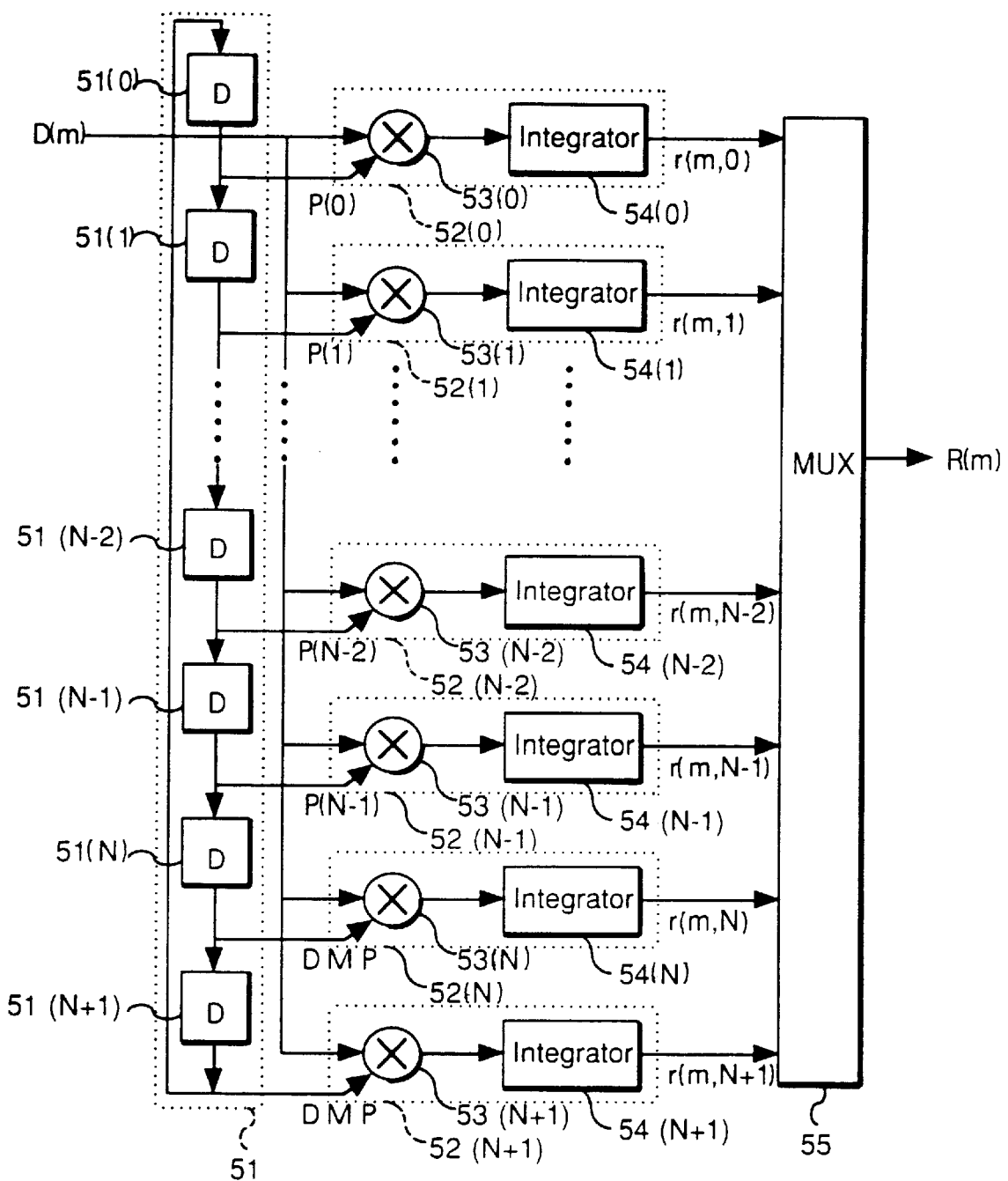
FIG. 5 is a schematic block diagram showing an analog matched filter in accordance with yet another embodiment of the present invention.

The following describes as yet another embodiment of the present invention an N type matched filter suitable for an analog matched filter referring to FIG. 5.

The basic structure of the matched filter of the present embodiment is the same as that of the matched filter of FIG. 1. Namely, as shown in FIG. 5, the matched filter of the present embodiment includes a delay circuit 51, a correlator (correlating means) 52 composed of a multiplier (multiplying means) 53 and an integrator (integrating means) 54, and a multiplexer (selecting means) 55. The matched filter of the present embodiment is different from the matched filter of FIG. 1 by the number of correlators 52 and delay elements 51 provided, which is larger than the number N of correlators 12(*n*) and delay elements 11(*n*) of FIG. 1.

When the number of correlators 52 and delay elements 51 to be added to N is M, M is an integer which exceeds (settling time of damping in integrator 54)/$T_c$. Namely, the number of correlators 52 and the number of delay elements 51 are N+M ($0 \leq n \leq N+M-1$), respectively.

In FIG. 5, for the case of M=2, delay elements 51(N) and 51(N+1) and correlators 52(N) and 52(N+1) are added to the delay elements 51(*n*) and correlators 52(*n*), respectively. Namely, the delay element 51 and the correlator 52 are composed of N+1 delay elements 51(*q*) (q=0, 1, . . . , N-2, N-1, N, N+1) and N+1 correlators 52(*q*) (q=0, 1, . . . , N-2, N-1, N, N+1), respectively. Each correlator 52 is composed of a multiplier 53(*q*) and an integrator 54(*q*).

Delay elements 51(*q*) store the spreading signals P(n) and damp signals DMP which are not the spreading signal. The damp signals DMP are stored in two delay elements 51(*q*) on the preceding stages of the delay element 51(*q*) storing the spreading signal P(0) so as to follow the last spreading signal P(0) of one period of the spreading signals P(n).

In FIG. 5, at instant m, the damp signal DMP are stored in the delay elements 51(N) and 51(N+1). In actual case, each delay element 51(*q*) is a register of 2 bits, and a flag indicative of whether the signal to be stored is a spreading signal P(n) or damp signal DMP is stored in the first bit, and when the first bit is a flag indicating the spreading signal P(n), the spreading signal P(n) is stored in the second bit. On the other hand, when the first bit is a flag indicating the damp signal DMP, any signal can be stored in the second bit. Of the two bit data stored in each delay element 51(*q*), the flag itself (first bit) is the signal for deciding whether damping should be carried out by the integrator 54(*q*) of the correlator 52(*q*), and the spreading signal P(n) (second bit) is the input to the integrator 54(*q*) of the correlator 52(*q*).

The operation of this matched filter is the same as that of FIG. 1, except the damping by the integrator 54(*q*). The integrator 54(*q*) is damped when the flag of the first bit of the delay element 51(*q*) indicates the damp signal DMP.

Namely, first, at instant m, the correlator 52(0) outputs the cross-correlation function. Then, the multiplexer 55 selects this output as the matched filter output. Here, the integrators 54(N) and 54(N+1) carry out damping.

At the next instant m+1, the correlator 52(1) outputs the cross-correlation function. Meanwhile, the delay element 51(0) stores the damp signal DMP which had been stored in the delay element 51(N+1) at instant m. Here, the integrator 54(0) carries out damping. The integrator 54(N+1) carries out damping continuously. The delay element 51(N) stores the spreading signal P(N-1), and thus the correlator 52(N) caries out integration of one data.

Then, at the next instant m+2, the delay elements 51(0) and 51(1) store the damp signals DMP, and thus the integrator 54(0) carries out damping continuously, and the integrator 54(1) newly carries out damping.

Thereafter, the correlator 52(N) outputs the cross-correlation function at the instant m+N past one period of the spreading signals, and the integrators 54(N-2) and 54(N-1) carry out damping. The next time the correlator 52(0) outputs the cross-correlation function is at instant m+N+2, not instant m+N unlike the First Embodiment. Namely, the period by which a single correlator 52(*q*) outputs the correlation signal coincides with the number N+2 of the correlators 52(*q*), not the tap number N. Nevertheless, the correlation signal is outputted per instant without interruption.

In this manner, while damping is carried out by the integrators 54(*q*) of the two correlators 52(*q*) on the preceding stages of the correlator 52(*q*) which outputs the cross-correlation function, the remaining N correlators 52(*q*) continuously carry out integration, ensuring that the cross-correlation function is always outputted by one of the correlators 52(*q*) at each instant. The time one integrator 54(*q*) carries out damping is $2T_c$, which is longer than the settling time, and therefore it is possible to prevent the problem that accurate values cannot be outputted.

In the present embodiment, as described, by adding M correlators (52(N) and 52(N+1)) and M delay elements (51(N) and 51(N+1)), where M is the sampling number corresponding to the settling time associated with damping, it is not required to increase the damping rate. As a result, it is not required to increase the power consumption of the amplifier in the integrator 54(*q*). Further, unlike the delay elements and adders of the conventional matched filter as shown in FIG. 6, the output voltage does not change dynamically within the settling time of the integrator 54(*q*) operating integration, and thus the power consumption can be further reduced compared with the amplifier used in the conventional analog matched filter. Therefore, the power consumption of the entire matched filter can be reduced.

Note that, this matched filter with the extended damping time may be incorporated in the matched filters of the Second through Fourth Embodiments. Namely, it is possible to add and apply M delay elements of the chip period corresponding to the settling time associated with damping, and M (K×M when applying to Fourth Embodiment) correlators of the sampling period corresponding to the settling time associated with damping, as shown in FIG. 5, to each matched filter of the Second through Fourth Embodiments. As a result, a matched filter compatible with oversampling (when applied to Fourth Embodiment) and a matched filter compatible with long code (when applied to Second or Third Embodiment) are realized. However, when applying to the Second or Third Embodiment, M damp signals are successively outputted following the output of a usual spreading signal of one period in the spreading signal generator 26 of FIG. 2 or the spreading signal generator 36 of FIG. 3.

As described, the matched filters of the First through Third and Fifth Embodiments are an N-tap matched filter for carrying out an inverse spread process in a spread spectrum receiver, which includes N correlators (12,52) for determining cross-correlations of the received signal and spreading signals, a delay circuit (11,21,31,51) for outputting the spreading signals having a certain section length to correlators (12,52) by successively delaying the timing by a chip period, and a multiplexer (15,55) for successively selecting the N correlators (12,52) by the chip period, and the correlators (12,52) determine cross-correlation functions of the received signal which has been sampled at a certain timing and the spreading signals from the delay circuit (11,21,31, 51), and the multiplexer 15 selects one of the cross-correlation functions of the received signal which has been sampled at the certain timing and the spreading signal having the certain section length. The timing the multiplexer 15 selects one of the cross-correlation functions of the received signal and the spreading signals having a certain section length is preferably per period of the product of the chip period and N.

With the above arrangement, the matched filter is not required to adopt the active correlation method such as a parallel search, despite the fact that a plurality of correlators which operate in parallel are used. As a result, a circuit for controlling the phases of the spreading signals is not required, thus reducing circuit size.

As described, the matched filter of the Fourth Embodiment is an N-tap matched filter for carrying out an inverse spread process in a spread spectrum receiver, which includes N×K correlators 42 for determining cross-correlations of a received signal which has been oversampled with the 1/K interval of the chip period and the spreading signals, a delay circuit 41 for outputting the spreading signals having a certain section length to correlators 42 of K unit by successively delaying the timing by the chip period, and a multiplexer 45 for successively selecting the output of the N×K correlators 42 with the 1/K interval of the chip period, and the correlators 42 determine cross-correlations of the received signal which has been sampled in K unit and the spreading signals from the delay circuit 41, and the multiplexer 45 selects one of the outputs of the correlations of the received signal which has been sampled at the certain timing and the spreading signal of a certain section. The timing the multiplexer 45 selects one of the outputs of the correlation of the received signal and the spreading signals having the certain section length is preferably per period of the product of the oversampling period and N×K.

With this arrangement, the matched filter using the correlators which operate in parallel is made applicable to an oversampled received signal.

The tap number N of the matched filter is made equal to the spread ratio in the spread spectrum communications. This means that the tap number N is equal to the number of spreading signals contained in one period, and therefore the matched filter can output the cross-correlation function.

It is preferable that each correlator (12,42,52) includes a multiplier (13,43,53) for calculating the product of the received signal and the spreading signal, and an integrator (14,44,54) for integrating the product, and that the damp period of the integrator (14,44,54) is equal to the period for selecting one of the cross-correlation functions of the received signal which has been sampled at the certain timing and the spreading signals having the certain section length.

With this arrangement, the matched filter can accurately output the cross-correlation function of an integration section corresponding to the tap number. In particular, when the tap number N is equal to the spread ratio in the matched filter in spread spectrum communications, the matched filter can always output a cross-correlation function with the integration section of one period of the spreading signals.

It is preferable that each correlator (12,42,52) includes a multiplier (13,43,53) for calculating the product of the received signal and the spreading signal, and an integrator (14,44,54) for integrating the product, and that the damp period of the integrator (14,44,54) is an integer multiple of the period for selecting one of the cross-correlation functions of the received signal which has been sampled at the certain timing and the spreading signals having the certain section length.

With this arrangement, the matched filter can output a cumulative result of a cross-correlation function which is an integer multiple of the period of the spreading signals, and as a result the matched filter output becomes more noise resistant.

The delay circuit may be, for example, a delay circuit (11,41,51) composed of delay elements (11($n$), 41($nd$), 51($q$)) storing the spreading signals, which are provided in the form of a ring.

With this arrangement, the delay circuit (11,41,51) stores the spreading signals, and thus the spreading signal generator is not required, and therefore this arrangement is most suitable when there is only one kind of spreading signals.

The matched filter may include a spreading signal generator (26,36) for supplying spreading signals of different kind to the delay circuit (21,31).

This matched filter includes the spreading signal generator (26,36), and therefore is compatible with a spreading signals using a long code. Also, because the tap number can be made shorter than the spread ratio, the matched filter is also compatible with a short code with a long spread ratio.

It is preferable that the matched filter includes a spreading signal generator (36) for supplying the spreading signal to the delay circuit (31), the delay circuit (31) being composed of delay elements (31($n$)) storing the spreading signals, which are connected in the form of a ring, and a switch (37) for inputting the spreading signal from the spreading signal generator (36) to the delay elements (31($n$)) by breaking the connections in the ring.

In this matched filter, a new spreading signal from the spreading signal generator (36) can be stored in the delay circuit (31), making the matched filter compatible with several different kinds of spreading signals.

It is preferable in the matched filter that each correlator (12,42,52) includes the multiplier (13,43,53) for calculating the product of the received signal and the spreading signal, and the integrator (14,44,45) for integrating the product, and in the case where the integrator (14,44,45) is an analog circuit which caries out damping with the period equal to the period for selecting one of the cross-correlation functions of the received signal which has been sampled at the certain timing and the spreading signals having the certain section length, there are further provided correlators (52(N) and 52(N+1)) and delay circuits (51(N) and 51(N+1)), provided in the number in accordance with the damping time of each integrator (14,44,45), in addition to the correlators (12(0) to 12(N−1), 42(0) to 42(2N−1), 52(0) to 52(N−1)) provided in the number equal to the tap number N or K times the tap number N.

In this analog matched filter, time is not concern in damping by the integrator (14,44,54), and it is not required to increase the power consumption of the amplifier in the integrator (14,44,54), thus reducing the power consumption of the entire matched filter.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A matched filter for inversely spreading a received signal using spreading signals in a spread spectrum communications receiver, comprising:

a plurality of correlating means for determining cross-correlation functions of the received signal which has been sampled at a certain timing and spreading signals having a certain section length, the number of correlating means in said plurality of correlating means exceeds a spread ratio of the spreading signals;

spreading signal delaying means for successively transferring the spreading signals having the certain section length to said plurality of correlating means by delaying timings of the transfer by a period equal to the section length of the spreading signals: and selecting means for successively selecting one of the cross-correlation functions outputted from said plurality of correlating means, for each period equal to a sampling interval of the received signal, said plurality of correlating means are composed of analog circuits.

2. The matched filter as set forth in claim 1, wherein the output of said each correlating means is selected by said selecting means, per period equal to a product of the sampling interval of the received signal and a number of said plurality of correlating means.

3. The matched filter as set forth in claim 1, wherein:

said plurality of correlating means determine cross-correlation functions of (1) the received signal which has been sampled with an interval equal to the section length of the spreading signals and (2) the spreading signals having the certain section length, and said output of said each correlating means is selected by said selecting means, per period equal to the section length of the spreading signals.

4. The matched filter as set forth in claim 3, wherein the number of correlating means in said plurality of correlating means is equal to a spread ratio in spread spectrum communications.

5. The matched filter as set forth in claim 3, wherein said plurality of correlating means include:

multiplying means for calculating products of the received signal and the spreading signals; and integrating means for integrating the products of the received signal and the spreading signals, said integrating means carrying out damping by a period equal to L (L being a natural number) times the period by which one of the cross-correlation functions outputted from said plurality of correlating means is selected by said selecting means, and the number of correlating means in said plurality of correlating means exceeding a spread ratio of the spreading signals by a number in accordance with a time required for damping by said integrating means.

6. The matched filter as set forth in claim 5, wherein L is not less than 2.

7. The matched filter as set forth in claim 1, wherein:

said plurality of correlating means are divided into a plurality of groups, each group composed of K correlating means for determining a cross-correlation function of (1) the received signal which has been over-sampled with an interval equal to 1/K (K being an integer of not less than 2) times the section length of a spreading signal and (2) the spreading signal having a certain section length, said spreading signal delaying means successively transferring the spreading signal having the certain section length to each group of said plurality of correlating means by delaying the timings of the transfer by the period equal to the section length of the spreading signals, and said selecting means successively selecting one of the cross-correlation functions outputted from said plurality of correlating means for each period equal to 1/K times the section length of the spreading signals.

8. The matched filter as set forth in claim 7, wherein the number of correlating means in said plurality of correlating means is equal to K times a spread ratio in spread spectrum communications.

9. The matched filter as set forth in claim 7, wherein said plurality of correlating means include:

multiplying means for calculating products of the received signal and the spreading signals; and integrating means for integrating the products of the received signal and the spreading signals, said integrating means carrying out damping by a period equal to L (L being a natural number) times the period by which one of the cross-correlation functions outputted from said plurality of correlating means is selected by said selecting means, and the number of correlating means in said plurality of correlating means exceeding K times a spread ratio of the spreading signals by a number in accordance with a time required for damping by said integrating means.

10. The matched filter as set forth in claim 9, wherein L is not less than 2.

11. The matched filter as set forth in claim 1, wherein said plurality of correlating means include:

multiplying means for calculating products of the received signal and the spreading signals; and integrating means for integrating the products of the received signal and the spreading signals said integrating means carrying out damping by a period equal to L (L being a natural number) times the period by which one of the cross-correlating functions outputting from said plurality of correlating means is selected by said selecting means.

12. The matched filter as set forth in claim 11, wherein L is not less than 2.

13. The matched filter as set forth in claim 1, wherein said spreading signal delaying means is composed of a plurality of storing means storing the spreading signals, which are connected to one another in series in a form of a loop.

14. The matched filter as set forth in claim 1, further comprising:
spreading signal generating means for supplying one of the spreading signals to said spreading signal delaying means.

15. The matched filter as set forth in claim 1, wherein:
the spreading signals include a first series of spreading signals and a second series of spreading signals which are different from the first series of spreading signals, and
said spreading signal delaying means is composed of a plurality of storing means storing the first series of spreading signals, which are connected to one another in series in a form of a loop, and
said matched filter further includes:
spreading signal generating means for supplying the second series of spreading signals to said spreading signal delaying means; and
input means for inputting the second series of spreading signals from said spreading signal generating means to the plurality of storing means by opening the loop.

16. The matched filter as set forth in claim 1, wherein:
the spreading signals include a first series of spreading signals and a second series of spreading signals which are different from the first series of spreading signals, and
said spreading signal delaying means is composed of a plurality of storing means storing the first series of spreading signals, which are connected to one another in series in a form of a loop, and
said matched filter further includes:
spreading signal generating means for supplying the second series of spreading signals different from the first series of spreading signals to said spreading signal delaying means; and
switching means for switching (I) a first connection state in which the plurality of storing means are connected in the form of the loop and (II) a second connection state in which an input of a first stage of the plurality of storing means is connected to an output of said spreading signal generating means so that the second series of spreading signals are inputted to said spreading signal delaying means.

17. The matched filter as set forth in claim 1, wherein the number of correlating means in said plurality of correlating means exceed a spread ratio of the spreading signals by a number in accordance with a time required for damping by said integrating means.

18. A matched filter, for inversely spreading a received signal using spreading signals in a spread spectrum communications receiver, comprising:
a plurality of correlating means for determining cross-correlation functions of the received signal which has been sampled at a certain timing and spreading signals having a certain section length;
spreading signal delaying means for successively transferring the spreading signals having the certain section length to said plurality of correlating means by delaying timings of the transfer by a period equal to the section length of the spreading signals; and
selecting means for successively selecting one of the cross-correlation functions outputted from said plurality of correlating means, for each period equal to a sampling interval of the received signal,
wherein:
said plurality of correlating means are divided into a plurality of groups, each group composed of K correlating means for determining a cross-correlation function of (1) the received signal which has been oversampled with an interval equal to 1/K (K being an integer of not less than 2) times the section length of a spreading signal and (2) the spreading signal having a certain section length,
said spreading signal delaying means successively transferring the spreading signal having the certain section length to each group of said plurality of correlating means by delaying the timings of the transfer by the period equal to the section length of the spreading signals, and
said selecting means successively selecting one of the cross-correlation functions outputted from said plurality of correlating means for each period equal to 1/K times the section length of the spreading signals.

19. The matched filter as set forth in claim 18, wherein the number of correlating means in said plurality of correlating means is equal to K times a spread ratio in spread spectrum communications.

20. The matched filter as set forth in claim 18, wherein said plurality of correlating means include:
multiplying means for calculating products of the received signal and the spreading signals; and
integrating means for integrating the products of the received signal and the spreading signals,
said integrating means carrying out damping by a period equal to L (L being a natural number) times the period by which one of the cross-correlation functions outputted from said plurality of correlating means is selected by said selecting means, and
the number of correlating means in said plurality of correlating means exceeding K times a spread ratio of the spreading signals by a number in accordance with a time required for damping by said integrating means.

21. The matched filter as set forth in claim 20, wherein L is not less than 2.

22. A matched filter, for inversely spreading a received signal using spreading signals in a spread spectrum communications receiver, comprising:
a plurality of correlating means for determining cross-correlation functions of the received signal which has been sampled at a certain timing and spreading signals having a certain section length;
spreading signal delaying means for successively transferring the spreading signals having the certain section length to said plurality of correlating means by delaying timings of the transfer by a period equal to the section length of the spreading signals; and
selecting means for successively selecting one of the cross-correlation functions outputted from said plurality of correlating means, for each period equal to a sampling interval of the received signal,
wherein:
said plurality of correlating means determine cross-correlation functions of (1) the received signal which has been sampled with an interval equal to the section length of the spreading signals and (2) the spreading signals having the certain section length, said output of said each correlating means is selected by said selecting means, per period equal to the section length of the spreading signals, and said plurality of correlating means include:

multiplying means for calculating products of the received signal and the spreading signals; and integrating means for integrating the products of the received signal and the spreading signals, said integrating means carrying out damping by a period equal to L (L being a natural number) times the period by which one of the cross-correlation functions outputted from said plurality of correlating means is selected by said selecting means, and the number of correlating means in said plurality of correlating means exceeding a spread ratio of the spreading signals by a number in accordance with a time required for damping by said integrating means.

23. The matched filter as set forth in claim 22, wherein L is not less than 2.

* * * * *